US010209334B2

(12) United States Patent
Cohen

(10) Patent No.: US 10,209,334 B2
(45) Date of Patent: Feb. 19, 2019

(54) SYSTEM AND METHOD FOR CONTROLLING PARTIAL VOLUME EFFECTS IN MAGNETIC RESONANCE FINGERPRINTING

(71) Applicant: The General Hospital Corporation, Boston, MA (US)

(72) Inventor: Ouri Cohen, Teaneck, NJ (US)

(73) Assignee: The General Hospital Corporation, Boston, MA (US)

( * ) Notice: Subject to any disclaimer, the term of this patent is extended or adjusted under 35 U.S.C. 154(b) by 350 days.

(21) Appl. No.: 15/074,586

(22) Filed: Mar. 18, 2016

(65) Prior Publication Data

US 2016/0299206 A1 Oct. 13, 2016

Related U.S. Application Data

(60) Provisional application No. 62/144,778, filed on Apr. 8, 2015.

(51) Int. Cl.
  *G01R 33/56* (2006.01)
  *G01R 33/54* (2006.01)
  *G01R 33/50* (2006.01)

(52) U.S. Cl.
  CPC .............. *G01R 33/54* (2013.01); *G01R 33/50* (2013.01)

(58) Field of Classification Search
  CPC ............ G01R 33/4816; G01R 33/4818; G01R 33/482; G01R 33/4822; G01R 33/4824; G01R 33/4826; G01R 33/4828; G01R 33/483
  See application file for complete search history.

(56) References Cited

U.S. PATENT DOCUMENTS

2015/0346301 A1* 12/2015 Cauley ............... G01R 33/4828
  324/309
2016/0077169 A1* 3/2016 Cohen .................. G01R 33/288
  324/311

* cited by examiner

*Primary Examiner* — Tung X Nguyen
(74) *Attorney, Agent, or Firm* — Quarles & Brady LLP

(57) ABSTRACT

Systems and methods for estimating quantitative parameters of a subject from data acquired using a magnetic resonance imaging (MRI) system. The system includes a computer system configured to control the MRI system to acquire MR fingerprinting (MRF) data representing a plurality of different signal evolutions acquired using different acquisition parameter settings and reconstruct the MRF data into at least one image composed of a plurality of pixels or voxels formed of multiple compartments per pixel or voxel. The computer system is further configured to, on a compartment-by-compartment basis, compare a signal associated with each compartment to an initial dictionary comprising a plurality of signal templates that coarsely sample different acquisition parameters used to acquire the MRF data to determine quantitative parameters for each compartment. The computer system is further configured to generate a quantitative parameter map that indicates the quantitative parameters for each compartment.

21 Claims, 7 Drawing Sheets

SYSTEM AND METHOD FOR CONTROLLING PARTIAL VOLUME EFFECTS IN MAGNETIC RESONANCE FINGERPRINTING

CROSS-REFERENCE TO RELATED APPLICATIONS

This application is based on, claims priority to, and incorporates herein by reference in its entirety U.S. Provisional Patent Application Ser. No. 62/144,778, filed Apr. 8, 2015, and entitled "System and Method for Adaptive Dictionary Matching in Magnetic Resonance Fingerprinting."

STATEMENT REGARDING FEDERALLY SPONSORED RESEARCH

N/A.

BACKGROUND

The present disclosure relates to systems and methods for magnetic resonance imaging ("MRI"). More particularly, the disclosure relates to systems and methods for producing quantitative parameter maps using magnetic resonance fingerprinting ("MRF").

MRF is an imaging technique that enables quantitative mapping of tissue or other material properties based on random or pseudorandom measurements of the subject or object being imaged. Examples of parameters that can be mapped include longitudinal relaxation time, $T_1$; transverse relaxation time, $T_2$; main magnetic field map, $B_0$; and proton density, $\rho$. MRF is generally described in U.S. Pat. No. 8,723,518, which is herein incorporated by reference in its entirety.

The random or pseudorandom measurements obtained in MRF techniques are achieved by varying the acquisition parameters from one repetition time ("TR") period to the next, which creates a time series of images with varying contrast. Examples of acquisition parameters that can be varied include flip angle, radio frequency ("RF") pulse phase, TR, echo time ("TE"), and sampling patterns, such as by modifying one or more readout encoding gradients.

The data acquired with MRF techniques are compared with a dictionary of signal models, or templates, that have been generated for different acquisition parameters from magnetic resonance signal models, such as Bloch equation-based physics simulations. This comparison allows estimation of the desired physical parameters, such as those mentioned above. The parameters for the tissue or other material in a given pixel or voxel are estimated to be the values that provide the best signal template matching.

Quantitative parameters are estimated in MRF by matching acquired signals with pre-computed signals that are stored in a dictionary of tissue parameters. To ensure that a correct match is found for each acquired signal, the dictionary must cover a large range of tissue parameters and must have a fine resolution. These two requirements result in dictionaries that are large (e.g., on the order of one million entries). As a consequence of the large dictionary size, significant processing time is required to match acquired signals to the dictionary, and large storage space is needed to store the dictionaries.

To perform the matching, voxels are assumed to contain a single tissue type. In fact, depending on a given voxel's size and location, the voxel may contain a mixture of multiple tissue types with its signal being a weighted average of the different tissue types. Thus, even when a match is found, the accuracy of the match for any given voxel may be in question.

Thus, there remains a need to improve the accuracy, while maintain the efficiency, of creating quantitative parameters using MRF.

SUMMARY

The present disclosure overcomes the aforementioned drawbacks by providing a system and method for controlling partial-volume effects in MRF parameter maps using a multi-compartment model for each pixel or voxel and an adaptive reconstruction process. The multi-compartment model can be used to control partial-volume effects and the adaptive reconstruction process can be used to control the computational burden of the reconstruction process.

In accordance with one aspect of the disclosure, a magnetic resonance imaging (MRI) system is disclosed. The MRI system includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes a radio frequency (RF) system configured to apply an RF field to the subject and to receive magnetic resonance signals from the subject using a coil array and a computer system. The computer system is programmed to control the gradient system and the RF system to acquire MR fingerprinting (MRF) data representing a plurality of different signal evolutions acquired using different acquisition parameter settings and reconstruct the MRF data into at least one image composed of a plurality of pixels or voxels formed of multiple compartments per pixel or voxel. The computer system is also programmed to, on a compartment-by-compartment basis, compare a signal associated with each compartment to an initial dictionary comprising a plurality of signal templates that coarsely sample different acquisition parameters used to acquire the MRF data to determine quantitative parameters for each compartment. The computer system is further configured to generate a quantitative parameter map that indicates the quantitative parameters for each compartment.

In accordance with another aspect of the disclosure, a method is provided for determining quantitative parameters of a subject using a magnetic resonance imaging (MRI) system. The method includes selecting a desired model that indicates a number of multiple compartments per pixel or voxel to be analyzed and providing MR data acquired with an MRI system, the acquired MR data representing a plurality of different signal evolutions acquired using different acquisition parameter settings. The method also includes, on a compartment-by-compartment basis, comparing each of the number of multiple compartments per pixel or voxel to an initial dictionary comprising a plurality of signal templates that coarsely sample acquisition parameters used when acquiring the provided MR data to determine quantitative parameters for each compartment per pixel or voxel. The method further includes generating a quantitative parameter map that indicates the quantitative parameters for each compartment per pixel or voxel.

In accordance with yet another aspect of the disclosure, a method is provided for determining quantitative parameters of a subject using magnetic resonance fingerprinting (MRF) data. The method includes selecting a desired model that indicates a number of multiple compartments per pixel or voxel to be analyzed and providing MRF data acquired with an MRI system, the acquired MR data representing a plurality of different signal evolutions acquired using different acquisition parameter settings. The method also includes, on a compartment-by-compartment basis, comparing each of the number of multiple compartments per pixel or voxel to a dictionary comprising a plurality of acquisition parameters used when acquiring the MRF data to determine quantitative parameters for each compartment per pixel or voxel. The method further includes generating a quantitative parameter map that indicates the quantitative parameters for each compartment per pixel or voxel.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1A:
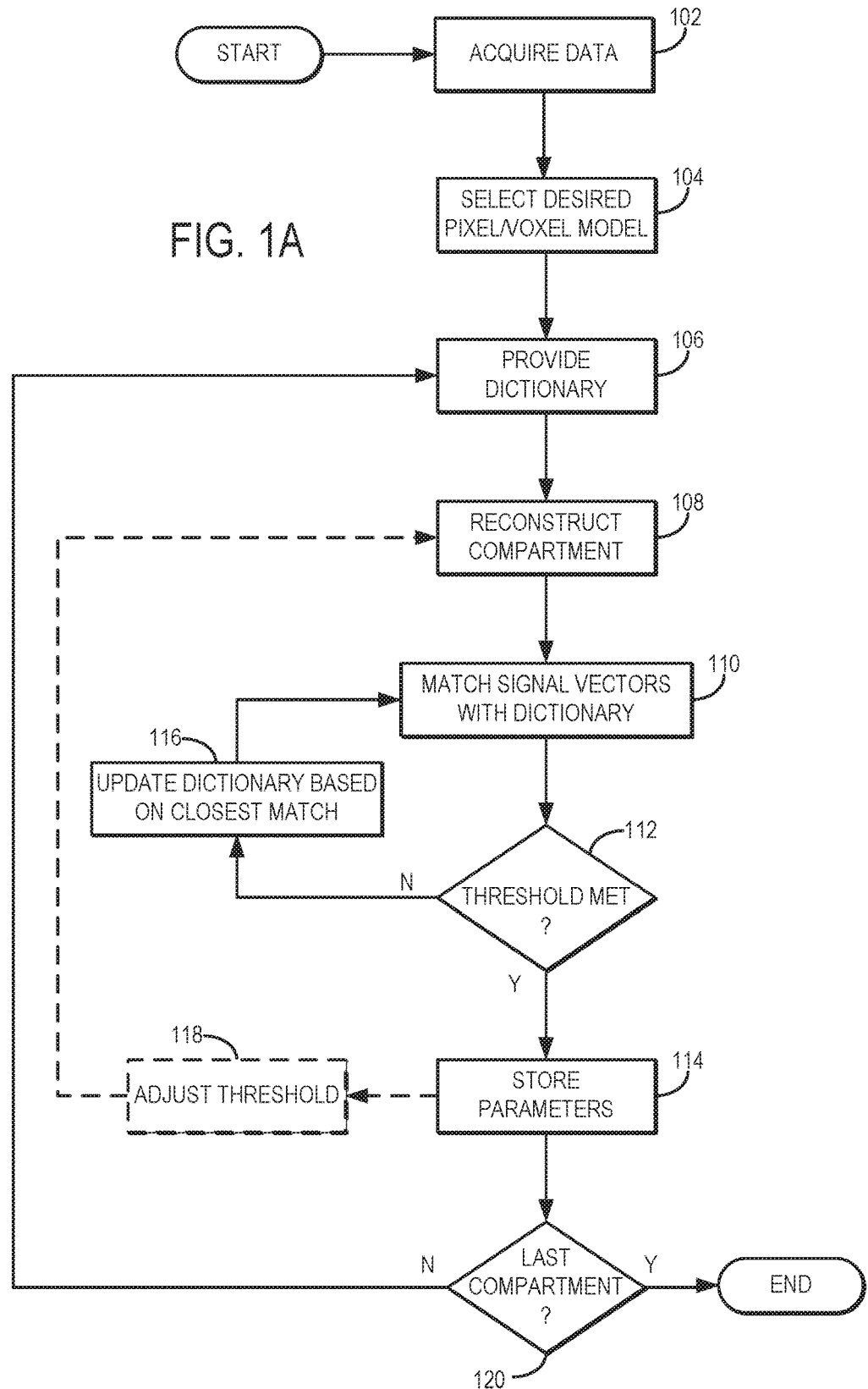
FIG. 1A is a flowchart setting forth the steps of an example method for performing magnetic resonance fingerprinting ("MRF") using an adaptively updated dictionary.

Described here are systems and methods for estimating quantitative parameters with magnetic resonance fingerprinting ("MRF"), in which acquired signal vectors are matched with a dictionary that may be, for example, efficiently used and adaptively generated.

In general, MRF techniques utilize a data acquisition scheme that causes signals from different materials or tissues to be spatially and temporally incoherent by continuously varying acquisition parameters throughout the data acquisition process. Examples of acquisition parameters that can be varied include flip angle, radio frequency ("RF") pulse phase, repetition time ("TR"), echo time ("TE"), sampling patterns, such as by modifying readout encoding gradients, and the like. Preferably, the acquisition parameters are varied in a pseudorandom manner. As a result of the spatial and temporal incoherence imparted by the this acquisition scheme, each material or tissue is associated with a unique signal evolution or "fingerprint," that is a function of multiple different physical parameters, including longitudinal relaxation time, $T_1$; transverse relaxation time, $T_2$; main magnetic field map, $B_0$; and proton density, $\rho$.

Quantitative parameter maps can be generated from these acquired signals based on a comparison of the signals to a predefined dictionary of predicted signal evolutions. Each of these dictionaries is associated with different combinations of material, environmental, and acquisition parameters. As an example, the comparison of the acquired signals to a dictionary can be performed using any suitable matching or pattern recognition technique. This comparison results in the selection of a signal vector, which may constitute a weighted combination of signal vectors, from the dictionary that best correspond to the observed signal evolution. The selected signal vector includes values for multiple different quantitative parameters, which can be extracted from the selected signal vector and used to generate the relevant quantitative parameter maps. The parameter maps may cover a broad range of clinically-relevant parameters and can be extended to other aims, such as measuring vascular oxygenation in vivo.

As described above, quantitative parameters can be estimated in MRF by matching acquired signals with pre-computed signals that are stored in a relatively large dictionary of tissue parameters. This matching can require significant processing time to match acquired signals to the large dictionary, and large storage space is needed to store the dictionaries. Additionally, the range of the tissue parameters needed in a dictionary can be imprecise based on different pathological conditions and partial-volume effects. The partial-volume effect can be overcome by using a multiple-compartment model for each pixel or voxel, rather than a single-compartment model for each pixel or voxel. However, for an N-compartment model, a simple matching of the signal to a dictionary with a range of M tissue property values would require the computation of MN entries. Since, in practice, M can be >1000, even an N=2 model would become computationally burdensome to the point of destroying the clinical viability of MRF-derived parameter maps. Thus, as will be described, the present disclosure provides systems and methods that overcome this challenge for an arbitrarily-size, multi-compartment model of size N by balancing the computational burden using an adaptive matching MRF reconstruction process.

Referring now to FIG. 1, a flowchart is provided that sets forth the steps of an example method for estimating quantitative parameters using MRF techniques and a user-selected multi-compartment model for each pixel or voxel. The method includes acquiring or otherwise providing MRF data, as indicated at step 102. For instance, data may be acquired with an MRI system performing a suitable MRF data acquisition. In one non-limiting example, a modified MRF spin-echo EPI sequence may be used. As another example, data can be provided, such as by retrieving previously acquired data from a suitable storage medium.

At process block 104, a user may select a desired pixel or voxel model. For example, as explained above, traditional MRF reconstruction processes use a model with a single-compartment per pixel or voxel (i.e., single-compartment model for each pixel or voxel). However, in accordance with the present disclosure, the number of compartments per pixel or voxel model may be arbitrary. As a non-limiting example, a 2-compartment model will be described. That is, in this non-limiting example, each pixel or voxel will be divided into two compartments and the signal from each compartment will be analyzed for dictionary matching to, thereby, generate an MRF parameter map that is less susceptible to partial-volume effects than a single-compartment model. Of course, as explained above, when increasing the number of compartments per pixel or voxel at process block 104, the number of matchings that must be performed increases the computational burden. However, to reduce the computational burden and, thereby, allow an increased number of compartments per pixel or voxel, an adaptive reconstruction process may be used. That is, an adaptive reconstruction process is able to increase the efficiency of the overall process for creating MRF parameter maps. Thus, despite the increase in computational burden by selecting an multi-compartment model at process block 104, the overall computational burden is controlled to ensure that the process remains within clinically-accepted times to provide results. In fact, at process block 104, the user may not only select the specifics of the multi-compartment model by the number of compartments desired, but may be provide with an estimate of the total reconstruction time so that the user can select the a multi-compartment model (e.g., 2, 3, 4, 5, 6, 7, 8, 9, 10, or more compartments per pixel or voxel) based on the amount of computational time that can be tolerated for the full MRF reconstruction process.

Thereafter, an initial dictionary may be provided, as indicated at step 106. To do so, a parameter range is selected. For example, the parameter range may have limits well above and below those expected in vivo. That is, vector trajectories may be computed over the parameter range and, stored in a matrix, A. To do so, this initial dictionary may coarsely sample the acquisition parameters used when acquiring the provided data.

Next, a given voxel or compartment can be reconstructed at step 108. Processing can be performed on a compartment-by-compartment basis using the initial dictionary, as indicated at step 110. For instance, a signal vector formed as the concatenation of acquired signals for a given compartment within a given pixel or voxel location is compared to entries in the initial dictionary. As one example, the comparison is based on a dot product between a given signal vector and each entry in the initial dictionary. Because the initial dictionary is significantly smaller than the conventional dictionaries used in MRF, this initial matching can be performed quickly and with a significantly reduced computational and data storage burden.

The comparison can be quantified by a numerical similarity measure, which can be checked against a threshold value to assess the similarity between a given signal vector and entry in the initial dictionary, as indicated at decision block 112. For instance, when a similarity measure is at or above a certain threshold value, the compartment associated with the signal vector can be assigned the parameters in the initial dictionary entry that was matched with the signal vector, as indicated at step 114.

If, for a given signal vector associated with a given compartment, none of the entries in the initial dictionary closely match the signal vector (i.e., the similarity measure is below the threshold value) the initial dictionary is updated using an adaptive routine, as indicated at step 116. For instance, the closest match in the initial dictionary is used to initialize a global optimization routine that searches the allowed parameter space for a better match. The parameter trajectories generated based on this optimum search may be reinserted into the dictionary to facilitate and speed up the matching of subsequent pixels or voxels.

In some configurations, the adaptive routine can include iteratively updating the threshold value, rather than adaptively modifying the initial dictionary. For instance, at optional process block 118, a higher or lower threshold can be used in subsequent iterations. In this regard, the process reiterates to process block 108 as the current dictionary entries can serve as the seed points for each subsequently-adjusted threshold. As such, it is possible to achieve desired precision in the match obtained and adjust the desired precision. For example, the current dictionary can be iteratively refined by iterating, as described, with the current dictionary entries as the seed points and using a repeatedly higher threshold.

The constraints for and/or whether or not to iterate by adjusting thresholds can be used to further control computational times. For example, when a greater number of compartments per pixel or voxel are used, the number of threshold adjustments can be limited to control computational time. Additionally or alternatively, signal matching can be initialized based on prior matches for compartments in the same pixels/voxel and/or adjacent pixels/voxels.

In particular, after a match is determined within the desired thresholds, at decision block 120, a check is made to determine if all compartments have been matched. If not, the process iterates for the next compartment. However, if a match is determined for a given compartment or in a given adjacent pixel or voxel, it is likely that matches in subsequent compartments in the same pixel or voxel, or adjacent pixels/voxels may be more likely to be found using signals similar to that prior match. Thus, initial dictionaries at process block 106 or match assessments at process block 110 can be biased using information from prior iterations.

The systems and methods of the present invention are thus capable of yielding smaller dictionaries for use in MRF applications. Moreover, the dictionaries may be specifically adapted to the acquired data, resulting in better matching. Because the dictionaries are generated based on the acquired data, it is not necessary to acquire foreknowledge or rely on a priori calculations of the tissue parameters.

The above-described process was used in a variety of non-limiting experiments to demonstrate the ability of using multi-compartment models with adaptive reconstructions processes to yield improved results, compared to a model with a single compartment per pixel or voxel, at clinically-acceptable reconstruction times.

In one non-limiting example, the MRF data was acquired using a set trajectory of length of 10 generated at random. In this non-limiting example, one experiment used a single-compartment model that reflects a given set of tissue parameters ($T_1$, $T_2$, and the like). In another, non-limiting example, a 2-compartment model was used that reflects the same set of tissue with parameters, but with different values underlying values for the tissue parameters. The signals from both models were plotted, as well as their difference and the average of the difference signal calculated. Repeating the acquisition 4 times with the $T_1/T_2$ values for the compartments set according to Table 1.

TABLE 1

| Acquisition | Compartment 1 | | Compartment 2 | |
| --- | --- | --- | --- | --- |
| | $T_1$ (ms) | $T_2$ (ms) | $T_1$ (ms) | $T_2$ (ms) |
| 1 | 1350 | 40 | 1350 | 40 |
| 2 | 1350 | 40 | 1450 | 40 |
| 3 | 1350 | 40 | 1350 | 60 |
| 4 | 1350 | 40 | 1350 | 100 |

Reconstruction of the acquired data was accomplished using the above-described adaptive matching method. Rather than searching the 2D $T_1/T_2$ space of the single compartment, the 4D space (T1/T2 for each compartment) was searched. Though the doubling of the compartment numbers per pixel or voxel increased the time required to arrive at the optimal match, it does not require a large dictionary and can be easily applied for N>2, which stands in contrast to a simple matching of the data.

Further experiments were performed. The signals resulting from the 1- and 2-compartment model for the various values of $T_1$ and $T_2$ and their difference signals are shown in FIGS. 1B-1I. The average difference for each experiment is tabulated in Table 2.

TABLE 2

| Acquisition | Average Difference (%) |
| --- | --- |
| 1 | 0 |
| 2 | 0.2 |
| 3 | 2.4 |
| 4 | 7.2 |

Figure 1B:
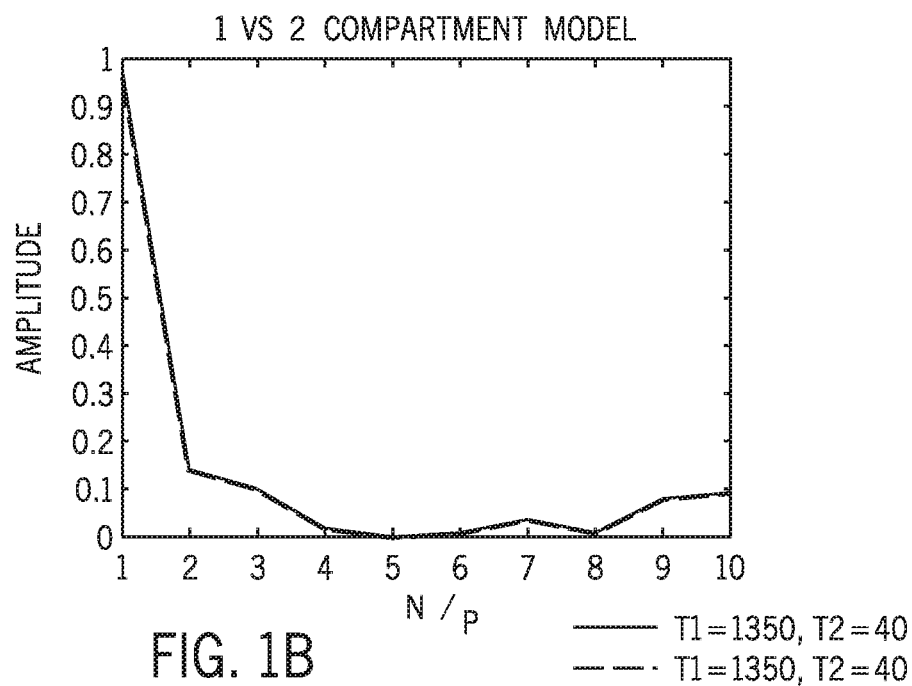
FIG. 1B is a graph showing experimental signals for a 1-compartment voxel model vs. a 2-compartment voxel model for a first set of experimental data.
Figure 1C:
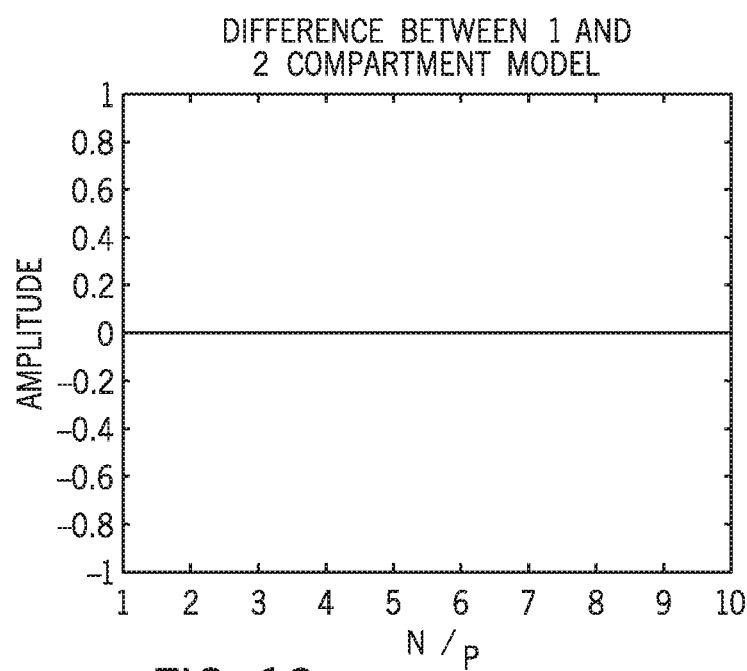
FIG. 1C is a graph showing a difference between the results of the 1-compartment voxel model and a 2-compartment voxel model for the first set of experimental data.
Figure 1D:
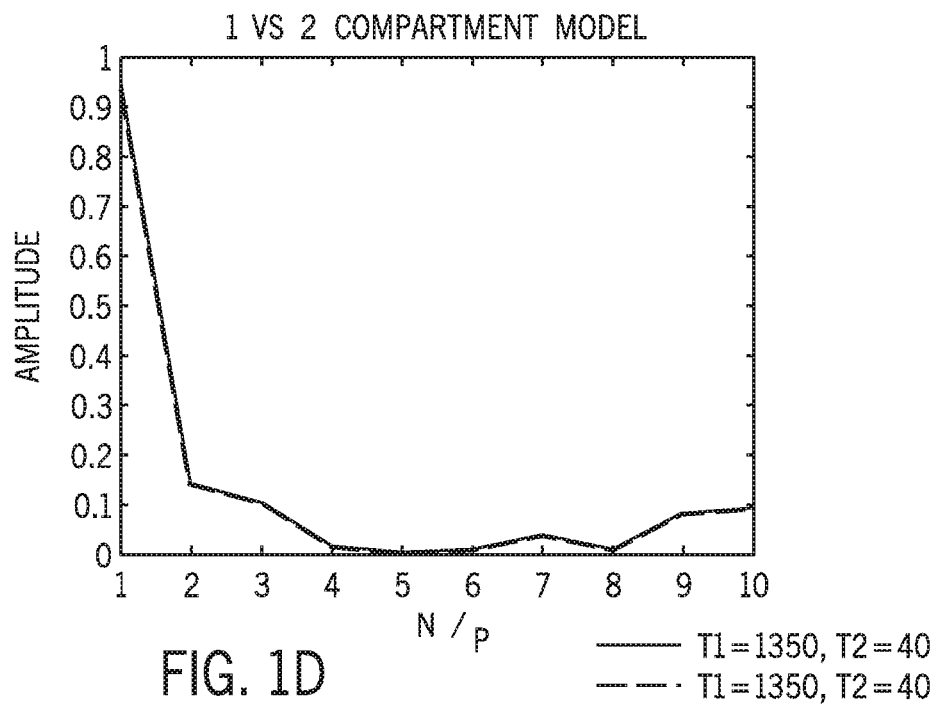
FIG. 1D is a graph showing experimental signals for a 1-compartment voxel model vs. a 2-compartment voxel model for a second set of experimental data.
Figure 1E:
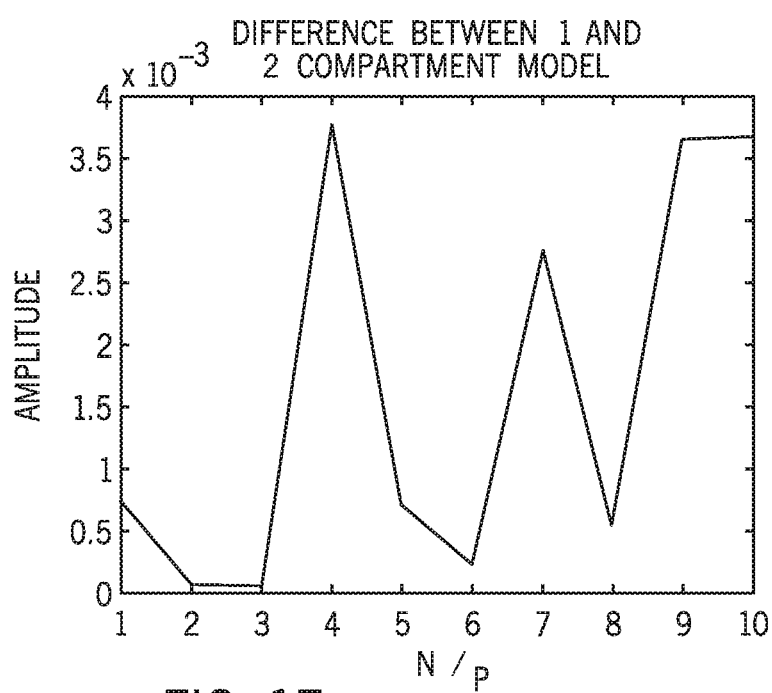
FIG. 1E is a graph showing a difference between the results of the 1-compartment voxel model and a 2-compartment voxel model for the second set of experimental data.
Figure 1F:
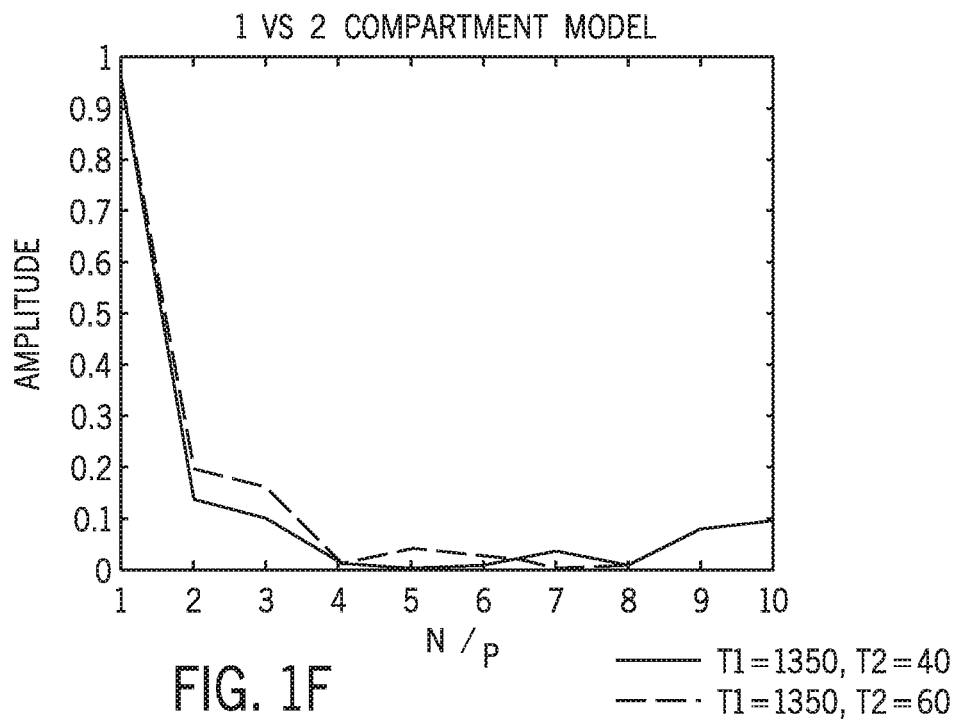
FIG. 1F is a graph showing experimental signals for a 1-compartment voxel model vs. a 2-compartment voxel model for a third set of experimental data.
Figure 1G:
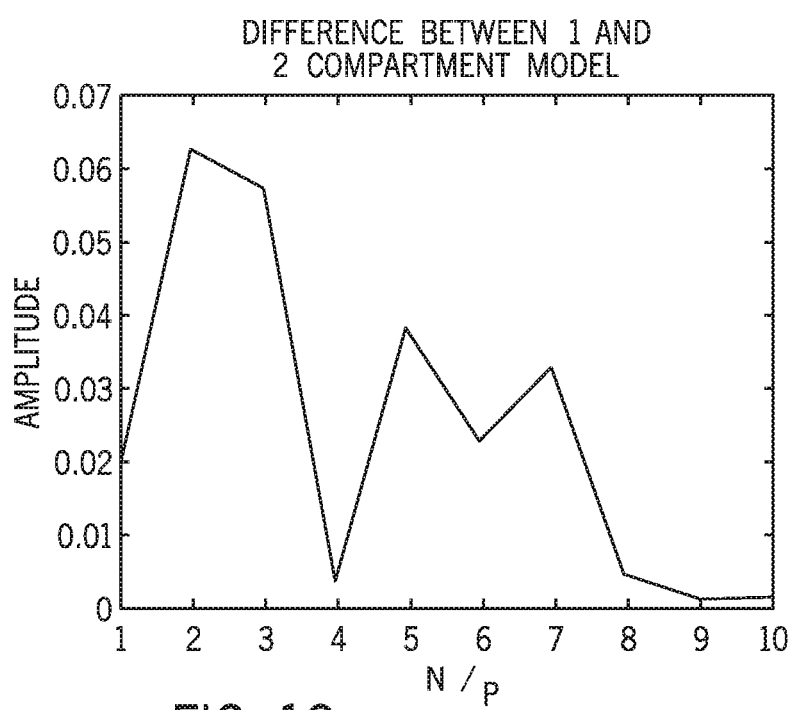
FIG. 1G is a graph showing a difference between the results of the 1-compartment voxel model and a 2-compartment voxel model for the third set of experimental data.
Figure 1H:
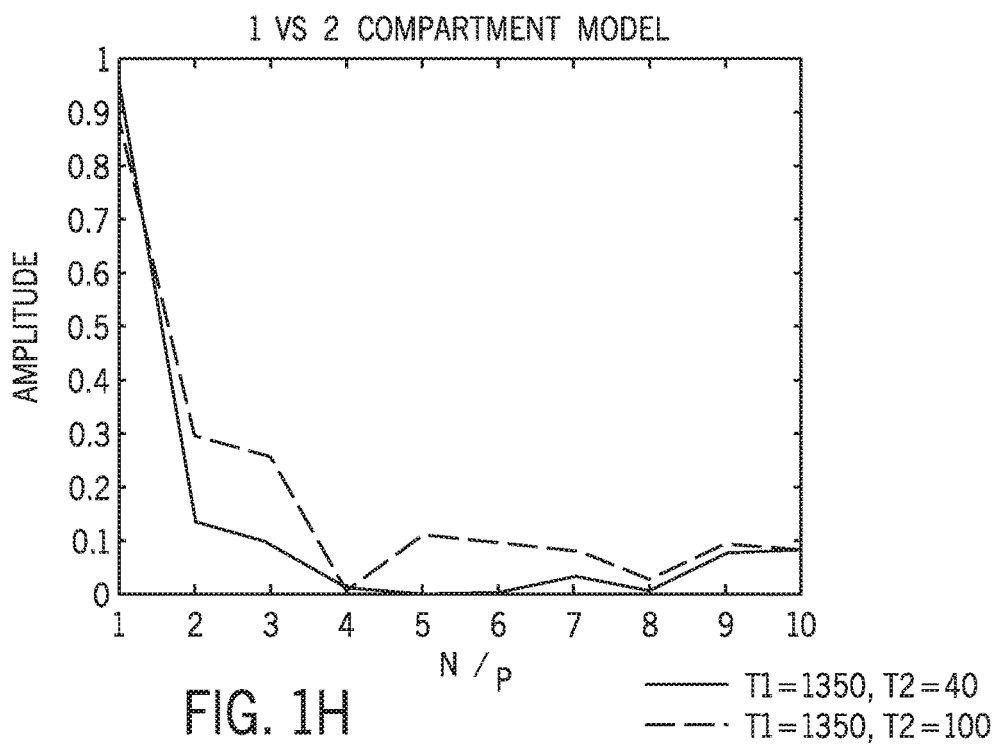
FIG. 1H is a graph showing experimental signals for a 1-compartment voxel model vs. a 2-compartment voxel model for a fourth set of experimental data.
Figure 1I:
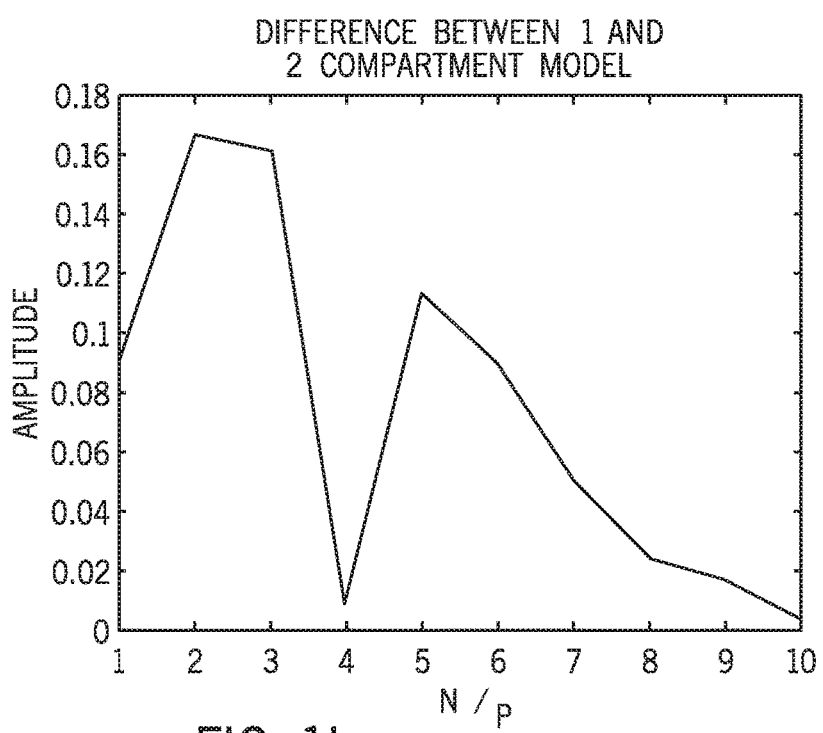
FIG. 1I is a graph showing a difference between the results of the 1-compartment voxel model and a 2-compartment voxel model for the fourth set of experimental data.

That is, FIG. 1B shows the signals acquired for acquisition 1 and FIG. 1C shows the difference between the results of the two models. Similarly, FIG. 1D shows the signals acquired for acquisition 2 and FIG. 1E shows the difference between the results of the two models. Also, FIG. 1F shows the signals acquired for acquisition 3 and FIG. 1G shows the difference between the results of the two models. Finally, FIG. 1H shows the signals acquired for acquisition 4 and FIG. 1I shows the difference between the results of the two models.

The results obtained demonstrate that the model having multiple-compartments per pixel or voxel (N=2) gives rises to a significantly different signal than that obtained using the model having single-compartment per pixel or voxel. In this non-limiting example, the difference between the resulting signals was maximized when the difference between the $T_2$s was greatest. This is due to the specifics of the trajectory namely the short TR used, and the above-described process can be adjusted further to allow for optimizing the trajectories to better discrimination of partial volumes.

Thus, the N-compartment model in conjunction with the adaptive matching algorithm can allow quantitative mapping of sub-voxel features to, thereby, substantially reduce the potential for misleading clinical results caused by partial volume effects.

Figure 2:
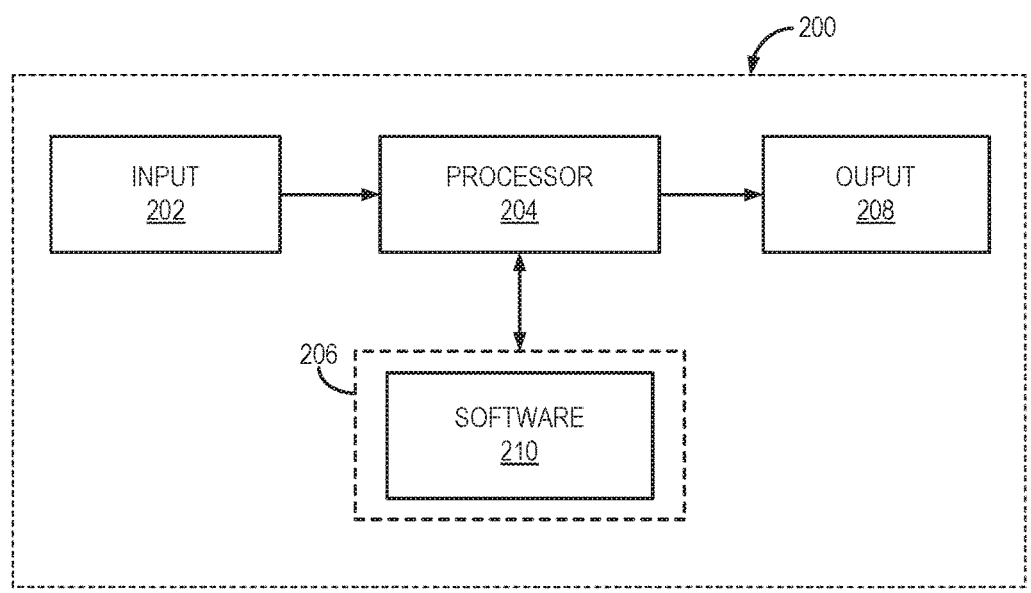
FIG. 2 is a block diagram of an example computer system that can implement some embodiments of the present invention.

Referring now to FIG. 2, a block diagram is illustrated of an example computer system 200 that can be used for producing an iteratively updated dictionary and for implementing an adaptive matching algorithm in accordance with some embodiments of the present invention. The system 200 generally may include an input 202, at least one processor 204, a memory 206, and an output 208. The system 200 may be, for example, a workstation, a notebook computer, a personal digital assistant ("PDA"), a multimedia device, a network server, a mainframe, or any other general-purpose or application-specific computing device. In some embodiments, the computer system 200 may form a part of a magnetic resonance imaging ("MRI") system, as will be described. The computer system 200 may operate autonomously or semi-autonomously, or may read executable software instructions from a computer-readable medium (such as a hard drive, a CD-ROM, flash memory, and the like), or may receive instructions from a user, or any another source logically connected to a computer or device, such as another networked computer or server, via the input 202.

The input 202 may take any shape or form, as desired, for operation of the computer system 200, including the ability for selecting, entering, or otherwise specifying parameters consistent with operating the computer system 200. In some instances, the input 202 may be designed to receive data acquired with an MRI system, which may be in the form of reconstructed images or raw k-space data.

Among the processing tasks for operating the computer system 200, the at least one processor 204 may be configured to perform the method described above with respect to FIG. 1.

The memory 206 may contain software 208, and may be configured for storage and retrieval of processed information and data to be processed by the processor 204. In some aspects, the software 208 may contain instructions directed to performing the method described above with respect to FIG. 1.

Figure 3:
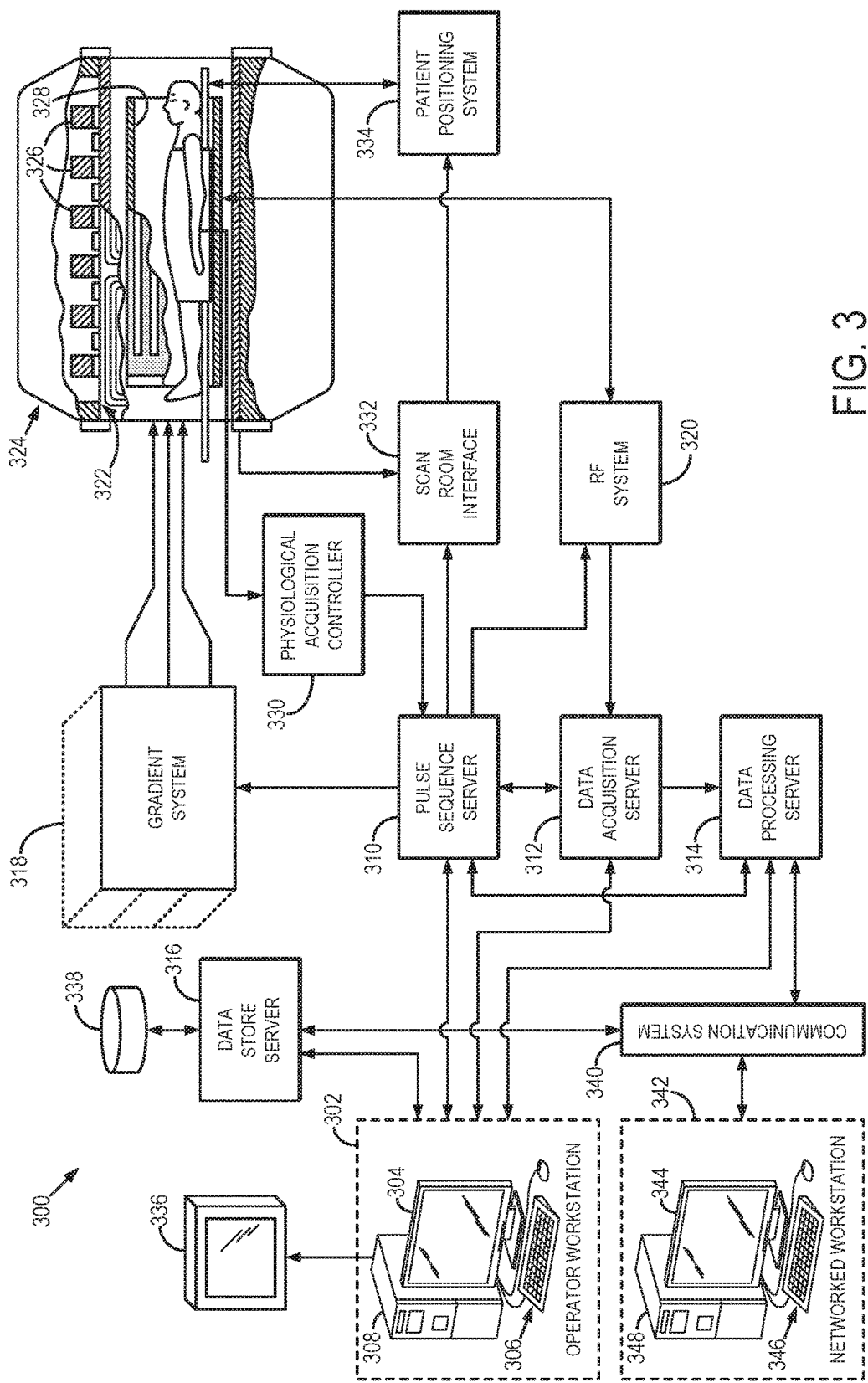
FIG. 3 is a block diagram of an example of a magnetic resonance imaging ("MRI") system.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil, are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images can be stored and/or output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system, comprising:
   a magnet system configured to generate a polarizing magnetic field about at least a portion of a subject arranged in the MRI system;
   a magnetic gradient system including a plurality of magnetic gradient coils configured to apply at least one magnetic gradient field to the polarizing magnetic field;

a radio frequency (RF) system configured to apply an RF field to the subject and to receive magnetic resonance signals from the subject using a coil array;
a computer system programmed to:
control the gradient system and the RF system to acquire MR fingerprinting (MRF) data representing a plurality of different signal evolutions acquired using different acquisition parameter settings;
reconstruct the MRF data into at least one image composed of a plurality of pixels or voxels formed of multiple compartments per pixel or voxel;
on a compartment-by-compartment basis, compare a signal associated with each compartment to an initial dictionary comprising a plurality of signal templates that coarsely sample different acquisition parameters used to acquire the MRF data to determine quantitative parameters for each compartment; and
generate a quantitative parameter map that indicates the quantitative parameters for each compartment.

2. The system of claim 1 wherein the computer system is further configured to receive a desired pixel or voxel model that indicates a number of multiple compartments per pixel or voxel.

3. The system of claim 2 wherein the number of multiple compartments per pixel or voxel is at least 2.

4. The system of claim 1 wherein to compare the signal, the computer system is further configured to, for a given compartment of the number of multiple compartments per voxel:
(i) store the quantitative parameters associated with an entry in the initial dictionary as the estimated quantitative parameters when the comparison satisfies a threshold criterion; and
(ii) update the initial dictionary when the comparison does not satisfy the threshold criterion, and wherein the computer system is configured to repeat comparing the signal using the updated dictionary.

5. The system of claim 4 wherein to update the initial dictionary, the computer system is configured to perform a global optimization that searches a parameter space encompassing potential quantitative parameters, and added entries to the initial dictionary based on the global optimization.

6. The system of claim 5 wherein, to perform the global optimization, the computer syste Withdrawn m is further configured to identify a seed entry based on the comparison.

7. The system of claim 6 wherein the computer system is further configured to identify the seed entry as an entry in the initial dictionary that, when compared to the MRF data, yields a similarity value closest to the threshold criterion for a given compartment of the number of multiple compartments per pixel or voxel.

8. The system of claim 1 wherein the computer system is further configured to select from the different acquisition parameter settings to include at least one of an echo time, a repetition time, a flip angle, a radio frequency (RF) pulse phase, or a k-space sampling pattern.

9. The system of claim 1 wherein the quantitative parameters include at least one of a longitudinal relaxation time, a transverse relaxation time, a longitudinal magnetization, a field map, or a proton density.

10. A method for determining quantitative parameters of a subject using a magnetic resonance imaging (MRI) system, the steps of the method comprising:
(a) selecting a desired model that indicates a number of multiple compartments per pixel or voxel to be analyzed;
(b) providing MR data acquired with an MRI system, the acquired MR data representing a plurality of different signal evolutions acquired using different acquisition parameter settings;
(c) on a compartment-by-compartment basis, comparing each of the number of multiple compartments per pixel or voxel to an initial dictionary comprising a plurality of signal templates that coarsely sample acquisition parameters used when acquiring the provided MR data to determine quantitative parameters for each compartment per pixel or voxel; and
(d) generating a quantitative parameter map that indicates the quantitative parameters for each compartment per pixel or voxel.

11. The method of claim 10 wherein the number of multiple compartments per pixel or voxel is at least 2.

12. The method of claim 10 wherein step (c) of comparing includes, for a given compartment of the number of multiple compartments per pixel or voxel:
(i) storing the quantitative parameters associated with an entry in the initial dictionary as the estimated quantitative parameters when the comparison satisfies a threshold criterion; and
(ii) updating the initial dictionary when the comparison does not satisfy the threshold criterion, and wherein step (c) is repeated using the updated dictionary.

13. The method of claim 12 wherein updating the initial dictionary in step (c)(ii) includes performing a global optimization that searches a parameter space encompassing potential quantitative parameters, and added entries to the initial dictionary based on the global optimization.

14. The method of claim 13 wherein performing the global optimization includes identifying a seed entry based on the comparison performed in step (c).

15. The method of claim 14 wherein the seed entry is identified as an entry in the initial dictionary that when compared to the provided MR data yields a similarity value closest to the threshold criterion for a given compartment of the number of multiple compartments per pixel or voxel.

16. The method of claim 10 wherein the different acquisition parameter settings includes at least one of an echo time, a repetition time, a flip angle, a radio frequency (RF) pulse phase, or a k-space sampling pattern.

17. The method of claim 10 wherein the quantitative parameters include at least one of a longitudinal relaxation time, a transverse relaxation time, a longitudinal magnetization, a field map, or a proton density.

18. A method for determining quantitative parameters of a subject using magnetic resonance fingerprinting (MRF) data, the steps of the method comprising:
(a) selecting a desired model that indicates a number of multiple compartments per pixel or voxel to be analyzed;
(b) providing MRF data acquired with an MRI system, the acquired MR data representing a plurality of different signal evolutions acquired using different acquisition parameter settings;
(c) on a compartment-by-compartment basis, comparing each of the number of multiple compartments per pixel or voxel to a dictionary comprising a plurality of acquisition parameters used when acquiring the MRF data to determine quantitative parameters for each compartment per pixel or voxel; and
(d) generating a quantitative parameter map that indicates the quantitative parameters for each compartment per pixel or voxel.

19. The method of claim 18 wherein initial dictionary comprises a plurality of signal templates that coarsely sample acquisition parameters used when acquiring the MRF data.

20. The method of claim 19 further comprising adjusting the dictionary and repeating step (c) with the dictionary after being adjusted.

21. The method of claim 18 wherein the quantitative parameter map provides a measure of vascular oxygenation in the subject.

* * * * *

UNITED STATES PATENT AND TRADEMARK OFFICE
CERTIFICATE OF CORRECTION

| | |
|---|---|
| PATENT NO. | : 10,209,334 B2 |
| APPLICATION NO. | : 15/074586 |
| DATED | : February 19, 2019 |
| INVENTOR(S) | : Ouri Cohen |

It is certified that error appears in the above-identified patent and that said Letters Patent is hereby corrected as shown below:

In the Specification

Column 1, Line 18, "N/A." should be --This invention was made with government support under W81XWH-09-2-0001 awarded by the Medical Research and Development Command. The government has certain rights in the invention--.

Signed and Sealed this
Ninth Day of May, 2023

Katherine Kelly Vidal
*Director of the United States Patent and Trademark Office*